(12) United States Patent
Dobashi et al.

(10) Patent No.: US 10,163,622 B2
(45) Date of Patent: Dec. 25, 2018

(54) SUBSTRATE CLEANING METHOD, SUBSTRATE PROCESSING METHOD, SUBSTRATE PROCESSING SYSTEM AND SEMICONDUCTOR DEVICE MANUFACTURING METHOD

(71) Applicant: TOKYO ELECTRON LIMITED, Tokyo (JP)

(72) Inventors: Kazuya Dobashi, Yamanashi (JP); Nobuyuki Takahashi, Tokyo (JP); Tatsuya Suzuki, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/326,018

(22) PCT Filed: May 22, 2015

(86) PCT No.: PCT/JP2015/064714
§ 371 (c)(1),
(2) Date: Jan. 12, 2017

(87) PCT Pub. No.: WO2016/009717
PCT Pub. Date: Jan. 21, 2016

(65) Prior Publication Data
US 2017/0207076 A1 Jul. 20, 2017

(30) Foreign Application Priority Data
Jul. 16, 2014 (JP) .................................. 2014-146021

(51) Int. Cl.
*H01L 21/02* (2006.01)
*B08B 5/00* (2006.01)
(Continued)

(52) U.S. Cl.
CPC ............ *H01L 21/0206* (2013.01); *B08B 5/00* (2013.01); *B08B 7/0035* (2013.01); *G03F 7/42* (2013.01);
(Continued)

(58) Field of Classification Search
CPC ........... H01L 21/0276; H01L 21/31138; H01L 21/31144; H01L 21/67196;
(Continued)

(56) References Cited

U.S. PATENT DOCUMENTS

2003/0073314 A1* 4/2003 Skinner ............. H01L 21/02063
438/689
2007/0184655 A1* 8/2007 Learn .................. C23C 14/0605
438/687
(Continued)

FOREIGN PATENT DOCUMENTS

JP 2007-134379 A 5/2007
JP 2010-287752 A 12/2010
(Continued)

OTHER PUBLICATIONS

International Search Report dated Aug. 4, 2015.

*Primary Examiner* — Duy Vu N Deo

(57) ABSTRACT

Disclosed is a substrate cleaning method. In this substrate cleaning method, a step (step 10) is performed wherein a removal target film and located above a processing target film is patterned; after step 10, a step (step 11) is performed wherein the patterned removal target film is used as an etching mask to perform anisotropic etching on the processing target film; after step 11, a step (step 12) is performed wherein the remaining removal target film on the processing target film is subjected to gas chemical etching; and after step 12, a step (step 14) is performed wherein a target substrate, which includes the surface of the processing target film, is irradiated with gas clusters, thereby cleaning the
(Continued)

surface of the processing target film by removing non-reactive or non-volatile residues remaining on the surface of the processing target film.

9 Claims, 14 Drawing Sheets

(51) Int. Cl.
| | | |
|---|---|---|
| B08B 7/00 | (2006.01) | |
| G03F 7/42 | (2006.01) | |
| H01L 21/027 | (2006.01) | |
| H01L 21/311 | (2006.01) | |
| H01L 21/67 | (2006.01) | |
| H01L 21/033 | (2006.01) | |
| H01L 21/3213 | (2006.01) | |

(52) U.S. Cl.
CPC .......... *G03F 7/427* (2013.01); *H01L 21/0276* (2013.01); *H01L 21/0337* (2013.01); *H01L 21/31116* (2013.01); *H01L 21/31138* (2013.01); *H01L 21/31144* (2013.01); *H01L 21/32139* (2013.01); *H01L 21/67196* (2013.01); *H01L 21/67201* (2013.01); *H01L 21/67207* (2013.01)

(58) Field of Classification Search
CPC ......... H01L 21/67201; H01L 21/67207; B08B 5/00; B08B 5/0035; G03F 7/42
See application file for complete search history.

(56) References Cited

U.S. PATENT DOCUMENTS

| | | |
|---|---|---|
| 2010/0317185 A1 | 12/2010 | Vos et al. |
| 2012/0244712 A1 | 9/2012 | Tsubata et al. |
| 2013/0056024 A1* | 3/2013 | Hoshino ........... H01L 21/02063 134/1.3 |
| 2015/0007858 A1 | 1/2015 | Matsuo et al. |

FOREIGN PATENT DOCUMENTS

| | | |
|---|---|---|
| JP | 2012-204652 A | 10/2012 |
| WO | 2013/128870 A1 | 9/2013 |

* cited by examiner (REFERENCE EXAMPLE)

(REFERENCE EXAMPLE)

(REFERENCE EXAMPLE)

SUBSTRATE CLEANING METHOD, SUBSTRATE PROCESSING METHOD, SUBSTRATE PROCESSING SYSTEM AND SEMICONDUCTOR DEVICE MANUFACTURING METHOD

CROSS REFERENCE

This application is a National Stage Application of, and claims priority to, PCT Application No. PCT/JP2015/064714, filed on May 22, 2015, entitled "SUBSTRATE CLEANING METHOD, SUBSTRATE PROCESSING METHOD, SUBSTRATE PROCESSING SYSTEM, AND SEMICONDUCTOR DEVICE MANUFACTURING METHOD," which claims priority to Japanese Patent Application No. 2013-062141, filed on Mar. 25, 2013, and to Japanese Patent Application No. 2014-146021, filed on Jul. 16, 2014. The foregoing patent applications are herein incorporated by reference by entirety for all purposes.

FIELD OF THE INVENTION

The present invention relates to a substrate cleaning method, a substrate processing method, a substrate processing system, and a semiconductor device manufacturing method.

BACKGROUND OF THE INVENTION

Along with a trend toward high integration of semiconductor devices, a wiring or an isolation width required for a manufacturing process is being miniaturized. Further, as three-dimensionallization of semiconductor devices advances, it is required to form, e.g., a long and deep line or hole shape having a high aspect ratio. In addition, various materials are used for semiconductor devices, so that it is required to deal with etching of various materials.

Therefore, in a semiconductor device manufacturing process, a sufficient etching selectivity may not be obtained by a current photoresist. In that case, a photoresist pattern is transferred to another film referred to as a hard mask film and, then, a processing target film below the hard mask film is etched while using the hard mask film as a mask (see, e.g., Patent Document 1).

The hard mask film serves as an etching mask and is not necessary in a semiconductor device. Therefore, the hard mask film on the processing target film in the semiconductor device is removed during the manufacturing process. Currently, in removing the hard mask film on the processing target film, wet etching (wet cleaning) is used as disclosed in, e.g., a paragraph [0024] of Patent Document 1. In the wet cleaning, liquid remains in a processing pattern and, thus, dry processing is required after the wet cleaning. However, if the miniaturization of semiconductor devices further progresses, a processing pattern becomes thinner and deeper. Therefore, the processing target film formed in the processing pattern is easily affected by surface tension of the liquid remaining in the pattern and may be destroyed during the dry processing.

As for a technique for preventing destruction of the pattern of the processing target film, gas chemical etching attracts attention (e.g., Patent Document 2). The gas chemical etching is a technique for chemically etching a film by using a reactant gas such as HF gas, $NH_3$ gas or the like.

Patent Document 1: Japanese Patent Application Publication No. 2012-204652

Patent Document 2: Japanese Patent Application Publication No. 2007-134379

However, in the case of employing the gas chemical etching, a non-volatile component or a non-reactant component contained in a removal target (hard mask film) remains on a surface of the processing target film. A residue caused by the non-reactant component or the non-volatile component causes adverse effect on patterning. Therefore, the residue needs to be removed. However, when the residue and the processing target film have the same component, it is difficult to ensure a selectivity between the residue and the processing target film even by performing a residue removal process using a gas that reacts with the residue and, also, the processing target film may be adversely affected by the residue removal.

When fine particles exist in a space portion of a fine mask pattern, the particles become a mask and, thus, a shape defect may occur after the patterning of the processing target film.

SUMMARY OF THE INVENTION

In view of the above, the present invention provides a substrate cleaning method capable of reliably removing a residue remaining on a surface of a processing target film after gas chemical etching of a removal target film without adversely affecting the processing target film, a substrate cleaning method capable of removing particles remaining on a space portion of a mask layer before etching of the processing target film, a substrate processing method including the substrate cleaning method, a substrate processing system capable of performing the substrate cleaning method, and a semiconductor device manufacturing method using the substrate cleaning method.

In accordance with a first aspect of the present invention, there is provided a substrate cleaning method for removing a non-reactant or a non-volatile residue remaining on a surface of a processing target film in a case of anisotropically etching the processing target film by using a removal target film patterned in a predetermined pattern as a mask and then performing gas chemical etching on the removal target film, the method including: removing the residue by irradiating gas clusters onto a surface to be processed including the surface of the processing target film after removal of the removal target film.

In accordance with a second aspect of the present invention, there is provided a substrate cleaning method for removing, before anisotropic etching of a processing target film by using a mask layer of a predetermined pattern, particles remaining on a space portion of the mask layer, the method including, removing the particles by irradiating gas clusters onto a surface to be processed including a surface of the mask layer and a surface of the processing target film.

In accordance with a third aspect of the present invention, there is provided a substrate processing method for forming a predetermined etching pattern on a target substrate, the method including: preparing a target substrate having a processing target film and a removal target film formed on the processing target film and used as an etching mask; patterning the removal target film in a predetermined pattern; anisotropically etching the processing target film by using the patterned removal target film as an etching mask; performing gas chemical etching on the removal target film remaining on the processing target film; and performing cleaning by removing a non-reactant or a non-volatile residue remaining on the processing target film by irradiating gas clusters onto a surface to be processed including a surface of the processing target film after the gas chemical etching.

In accordance with a fourth aspect of the present invention, there is provided a substrate processing method for forming a predetermined etching pattern on a target substrate, the method including: preparing a target substrate having a processing target film and a mask layer formed in a predetermined pattern on the processing target film and used as an etching mask; performing cleaning by removing particles on a space portion of the mask layer by irradiating gas clusters onto a surface to be processed including a surface of the mask layer and a surface of the processing target film; and anisotropically etching the processing target film by using the mask layer as an etching mask.

In accordance with a fifth aspect of the present invention, there is provided a substrate processing system for forming a predetermined etching pattern on a target substrate having a processing target film and a removal target film formed on the processing target film and used as an etching mask, the system including: a common transfer chamber; a load-lock module connected to the common transfer chamber and configured to transfer a target substrate to and from the common transfer chamber; an atmospheric transfer chamber connected to the load-lock module and configured to transfer the target substrate to and from an outside of the substrate processing system; a gas treatment module connected to the common transfer chamber and configured to perform gas chemical etching on the removal target film after anisotropically etching the processing target film by using the removal target film as an etching mask; and a gas cluster module connected to the common transfer chamber and configured to remove, after the gas chemical etching, a non-reactant or a non-volatile residue remaining on a surface of the processing target film by irradiating gas clusters onto a surface to be processed including the surface of the processing target film.

In accordance with a sixth aspect of the present invention, there is provided a substrate processing system for forming a predetermined etching pattern on a target substrate having a processing target film and a mask layer formed in a predetermined pattern on the processing target film and used as an etching mask, the system including: a common transfer chamber; a load-lock module connected to the common transfer chamber and configured to transfer a target substrate to and from the common transfer chamber; an atmospheric transfer chamber connected to the load-lock module and configured to transfer the target substrate to and from an outside of the substrate processing system; a gas cluster module connected to the common transfer chamber and configured to remove particles remaining on a space portion of the mask layer by irradiating gas clusters onto a surface to be processed including a surface of the mask layer and a surface of the processing target film; and an etching module connected to the common transfer chamber and configured to anisotropically etch the processing target film by using the mask layer as an etching mask.

In accordance with a seventh aspect of the present invention, there is provided a semiconductor device manufacturing method using a semiconductor substrate including a laminated body in which at least a first processing target film, a second processing target film, a third processing target film and a mask layer are laminated upward in that order on the substrate, the method including: anisotropically etching the third processing target film by using the mask layer as an etching mask; anisotropically etching the second processing target film by using the anisotropically etched third processing target film as an etching mask; performing gas chemical etching on the third processing target film remaining on the second processing target film; performing cleaning by removing a non-reactant or a non-volatile residue remaining on a surface of the second processing target film by irradiating gas clusters onto a surface to be processed including the surface of the second processing target film after the gas chemical etching; forming a sidewall spacer film on a surface of the first processing target film which is partially exposed and a side surface of the anisotropically etched second processing target film; removing the second processing target film; and anisotropically etching the first processing target film by using the sidewall spacer film as an etching mask layer.

In the present invention, the cleaning process for irradiating the gas clusters onto the target film including the surface of the processing target film after the removal of the removal target film by the gas chemical etching is performed, so that the non-reactant or the non-volatile residue remaining on the surface of the processing target film can be reliably removed without adverse effect on the processing target film. Further, since the cleaning process for irradiating the gas clusters is performed in a state where the mask layer before the etching of the processing target film exists, the particles remaining on the space portion of the mask layer can be removed.

DETAILED DESCRIPTION OF THE EMBODIMENTS

Figure 1:
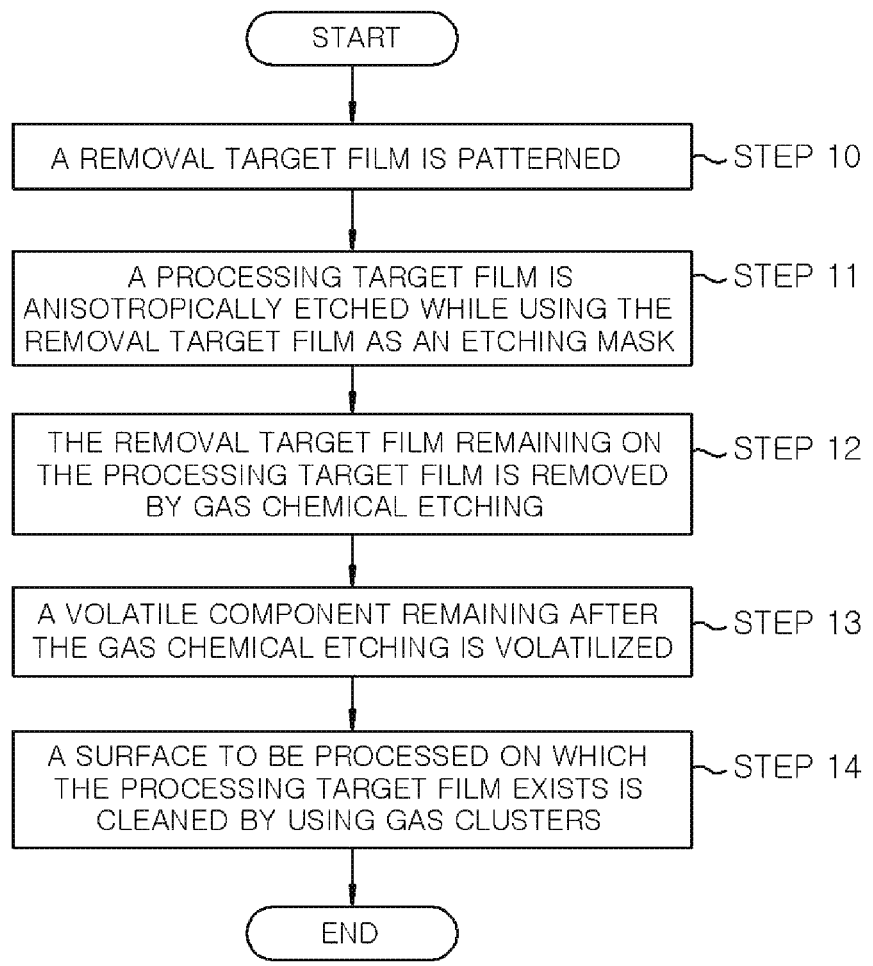
FIG. 1 is a flowchart showing an example of a substrate processing method according to a first embodiment.

Hereinafter, embodiments will be described with reference to the accompanying drawings. Further, like reference numerals will be used for like or corresponding parts throughout the drawings referred to in the embodiments.

First Embodiment (Substrate Processing Method)

FIG. 1 is a flowchart showing an example of a substrate processing method according to a first embodiment. FIGS. 2A to 2E are cross sectional views schematically showing states of a target object during a sequence shown in FIG. 1.

Figure 2A:
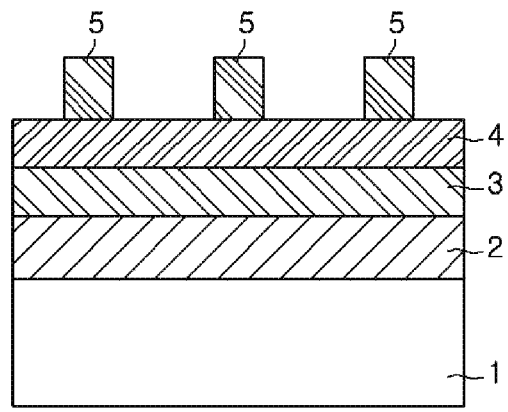
FIGS. 2A to 2E are cross sectional views schematically showing states of a target object during a sequence shown in FIG. 1.
Figure 2B:
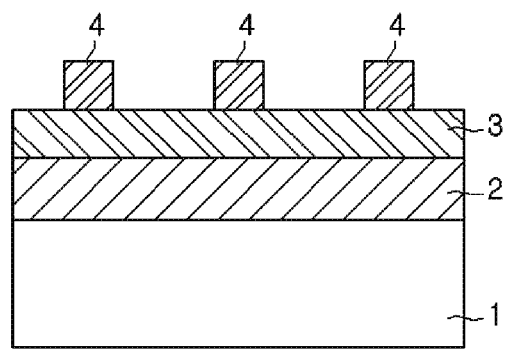

First, as shown in a step 10 of FIG. 1, a removal target film that is a hard mask film is patterned. A specific example thereof will be described. First, a semiconductor substrate, e.g., a silicon substrate 1, is used as a target object, as shown in FIG. 2A. A thin film 2 as an etching target film that will be finally etched is formed on the silicon substrate 1. The thin film 2 is not particularly limited. A processing target film 3 used as an etching mask of the thin film 2 is formed on the thin film 2. A removal target film (hard mask film) 4 used as an etching mask of the processing target film 3 is formed on the processing target film 3. Various materials may be used for the processing target film 3 and the removal target film 4. For example, the processing target film 3 may be an organic film such as an amorphous carbon film or the like. Or, the processing target film 3 may be an inorganic film such as an SiN film, an SiON film or the like. The removal target film 4 may be an SiARC (Si-containing anti-reflective coating), an organic film such as an SiOC film or the like, or an inorganic film mainly made of $SiO_2$. In order to pattern the removal target film 4, a photoresist is coated on the removal target film 4 and a photoresist layer is formed on the removal target film 4. Then, the photoresist layer is exposed and developed by using a photolithography method, and a photoresist pattern 5 is formed on the removal target film 4. Next, as shown in FIG. 2B, the removal target film 4 is anisotropically etched by, e.g., an RIE method, while using the photoresist pattern 5 as an etching mask. Thereafter, the photoresist pattern 5 remaining on the removal target film 4 is removed by ashing. Accordingly, the removal target film 4 is patterned.

Figure 2C:
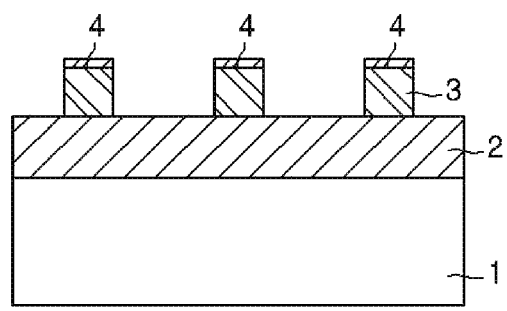

Next, as shown in a step 11 of FIG. 1 and FIG. 2C, the processing target film 3 is anisotropically etched by, e.g., the RIE method, while using the patterned removal target film 4 as an etching mask.

Figure 2D:
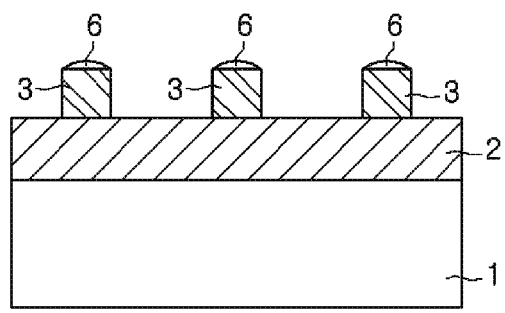

Next, as shown in a step 12 of FIG. 1 and FIG. 2D, the removal target film 4 remaining on the anisotropically etched processing target film 3 is removed by gas chemical etching. The gas chemical etching is a technique for chemically etching a film by using a reactant gas. For example, when the removal target film 4 is mainly made of $SiO_2$ or is an organic film containing Si such as SiARC, SiOC or the like, it is possible to use HF gas alone, or a gaseous mixture of HF gas and $NH_3$ gas, or ozone gas.

Next, as shown in a step 13 of FIG. 1, a volatile component remaining after the gas chemical etching is volatilized. In other words, a volatile residue component (reaction by-product) may be generated after the gas chemical etching. In that case, a step (post-treatment step) of further volatilizing the volatile component generated during the gas chemical etching is performed. For example, when an Si-based material is etched by a gaseous mixture of volatile HF gas and $NH_3$ gas, ammonium fluorosilicate is generated as a reaction by-product, and the ammonium fluorosilicate thus generated is volatilized. This step is executed by performing, e.g., heat treatment on the target object that has been subjected to the gas chemical etching. The step 13 may be executed if necessary and may be omitted when a volatile residue component is not generated.

FIG. 2D shows states of the target object immediately after the step 12 or the step 13. In the post-treatment executed after the gas chemical etching of the step 12 or after the gas chemical etching of the step 13, a reactant component and a volatile component in the removal target film 4 remaining on the processing target film 3 are removed. However, if a non-reactant component or a non-volatile component is contained in the removal target film 4, such a component is not removed by the gas chemical reaction and becomes residues 6 as shown in FIG. 2D. For example, the removal target film 4 that is an SiARC film or an organic-based film such as an SiOC film is removed by HF gas or $NH_3$ gas, carbon C mainly remains as a non-volatile component and becomes the residues 6. In the case of using an $SiO_2$ film formed by CVD as the removal target film 4, if C originated from a precursor is contained as impurities, the residues 6 mainly containing C are generated.

When the removal target film 4 of an SiOC film is removed by ozone gas, SiO remains as a non-volatile component and becomes the residues 6.

When the residues 6 are carbon and the processing target film 3 is an amorphous carbon film, or when the residues 6 are SiO and the removal target film is an SiN film, the processing target film 3 and the residues 6 on the processing target film 3 have the common component. Therefore, it is difficult to selectively remove the residues 6 on the processing target film 3 by using a chemical reaction without adverse effect on the processing target film 3.

Figure 2E:
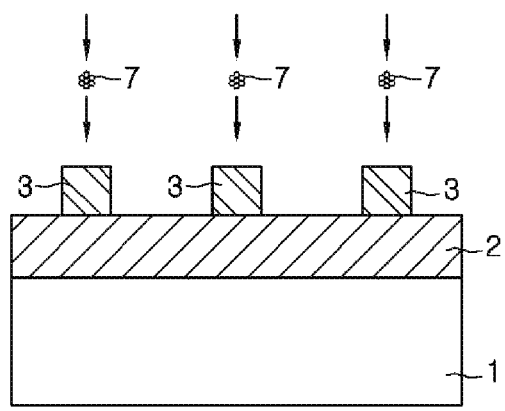

Therefore, in the present embodiment, as shown in a step 14 of FIG. 1 and FIG. 2E, a surface to be processed on which the processing target film 3 exists is cleaned by using gas clusters after the step 12 or the step 13. By irradiating the gas clusters onto the surface to be processed, the residues 6 can be removed by physical collision, not by chemical reaction, without adverse effect on the processing target film 3. The reason that the residues can be physically removed is that the residues 6 in this example are laminated on the processing target film 3 without chemical bond with the processing target film 3. Therefore, the residues 6 have a physical strength weaker than that of the processing target film 3 and can be easily removed by physical action of the irradiation of gas clusters 7.

The gas clusters 7 are generated by, e.g., thermal expansion of a gas. As for the gas, it is possible to use, e.g., Ar gas, $N_2$ gas, $CO_2$ gas, $CF_4$ gas, $SF_6$ gas, $ClF_3$ gas, HF gas or the like. Or, it is also possible to use steam of liquid such as $H_2O$ or the like. Or, a gaseous mixture of the above-described gases may be used. Or, He gas may be added to the above-described gases.

By physically removing the residues 6, it is possible to selectively remove only the residues 6 from the processing target film 3 as shown in FIG. 2E even when the processing target film 3 and the residues 6 have the common component and when the processing target film 3 and the residues 6 are made of the same material.

After the residues 6 are removed, the thin film 2 is anisotropically etched by, e.g., the RIE method, while using the processing target film 3 as a mask. As a consequence, a predetermined etching pattern is obtained.

In the first embodiment, the residues 6 remaining on the surface of the processing target film 3 after the gas chemical etching can be reliably removed without adverse effect on the processing target film 3.

(Substrate Processing System)

Figure 3:
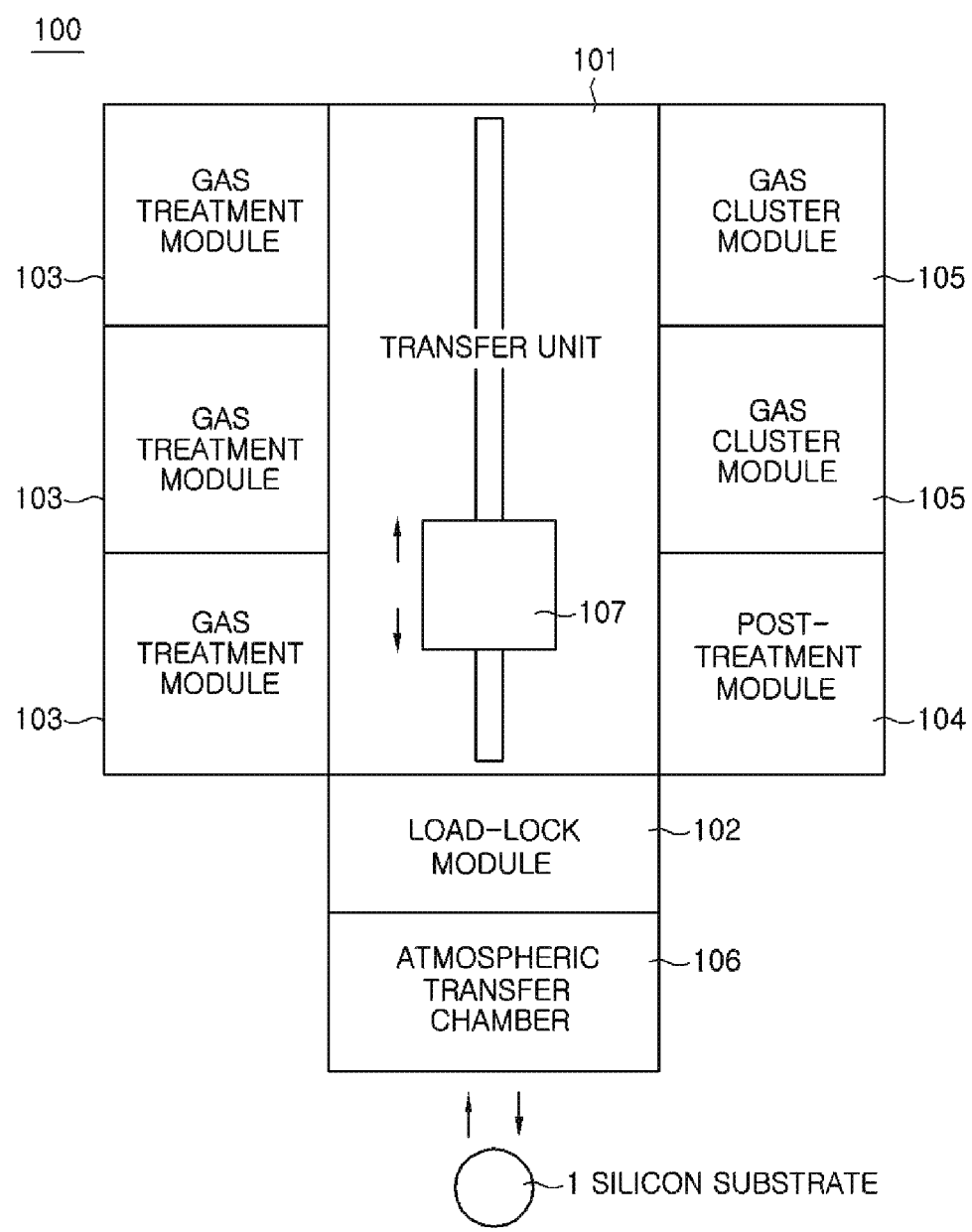
FIG. 3 is a top view showing an example of a substrate processing system capable of implementing the example of the substrate processing method according to the first embodiment.

FIG. 3 is a top view showing an example of a substrate processing system capable of performing the example of the substrate processing method according to the first embodiment.

As shown in FIG. 3, the substrate processing system 100 includes a common transfer chamber 101. The common transfer chamber 101 is connected to a load-lock module 102, gas treatment modules 103, a post-treatment module 104, and gas cluster modules 105. In this example, the common transfer chamber 101 is formed in a rectangular shape. The three gas treatment modules 103 are connected to one side of the rectangle and the single post treatment module 104 and the two gas cluster modules 105 are connected to the opposite side to the one side. The load-lock module 102 is connected to one of the remaining sides. An atmospheric transfer chamber 106 is connected to the load-lock module 102 at a side opposite to a side where the common transfer chamber 101 is connected.

The silicon substrate 1 is transferred between the atmospheric transfer chamber 106 and the outside of the substrate processing system 100. The silicon substrate 1 loaded into the atmospheric transfer chamber 106 from the outside has been subjected to the processes up to the step 11 in FIG. 1 and thus has a state shown in FIG. 2C. The silicon substrate 1 loaded into the atmospheric transfer chamber 106 is aligned by an aligner (not shown) provided in the atmospheric transfer chamber 106 and then transferred into the load-lock module 102 by a transfer unit (not shown) provided in the atmospheric transfer chamber 106.

The load-lock module 102 has a load-lock chamber where a pressure can be changed. The silicon substrate 1 is loaded into the load-lock chamber. After the inside of the load-lock chamber is changed from an atmospheric pressure state to a depressurized state, the silicon substrate 1 is transferred to the common transfer chamber 101.

In the common transfer chamber 101, a transfer unit 107 is provided. The transfer unit 107 unloads the silicon substrate 1 from the load-lock chamber into the common transfer chamber 101. Then, the transfer unit 107 loads the silicon substrate 1 into the gas treatment module 103.

In the gas treatment module 103, the step 12 (gas chemical etching) of FIG. 1 is performed. Upon completion of the gas chemical etching, the transfer unit 107 unloads the silicon substrate 1 from the gas treatment module 103 and loads the silicon substrate 1 into the post-treatment module 104.

In the post-treatment module 104, the step 13 (heat treatment for volatilizing a volatile component) of FIG. 1 is performed. After the heat treatment is completed, the transfer unit 107 unloads the silicon substrate 1 from the post-treatment module 104 and loads the silicon substrate 1 into the gas cluster module 105.

In the gas cluster module 105, the step 14 (cleaning) of FIG. 1 is executed. Upon completion of the cleaning, the transfer unit 107 unloads the silicon substrate 1 from the gas cluster module 105 and loads the silicon substrate 1 into the load-lock chamber of the load-lock module 102.

After the inside of the load-lock chamber is switched from the depressurized state to the atmospheric pressure state, the silicon substrate 1 is unloaded to the atmospheric transfer chamber 106 by the transfer unit (not shown) provided in the atmospheric transfer chamber. Thereafter, the silicon substrate 1 is unloaded from the atmospheric transfer chamber 106 to the outside of the substrate processing system 100.

The substrate processing method according to the first embodiment can be performed by the substrate processing system 100 shown in FIG. 3.

(Gas Cluster Module)

Figure 4:
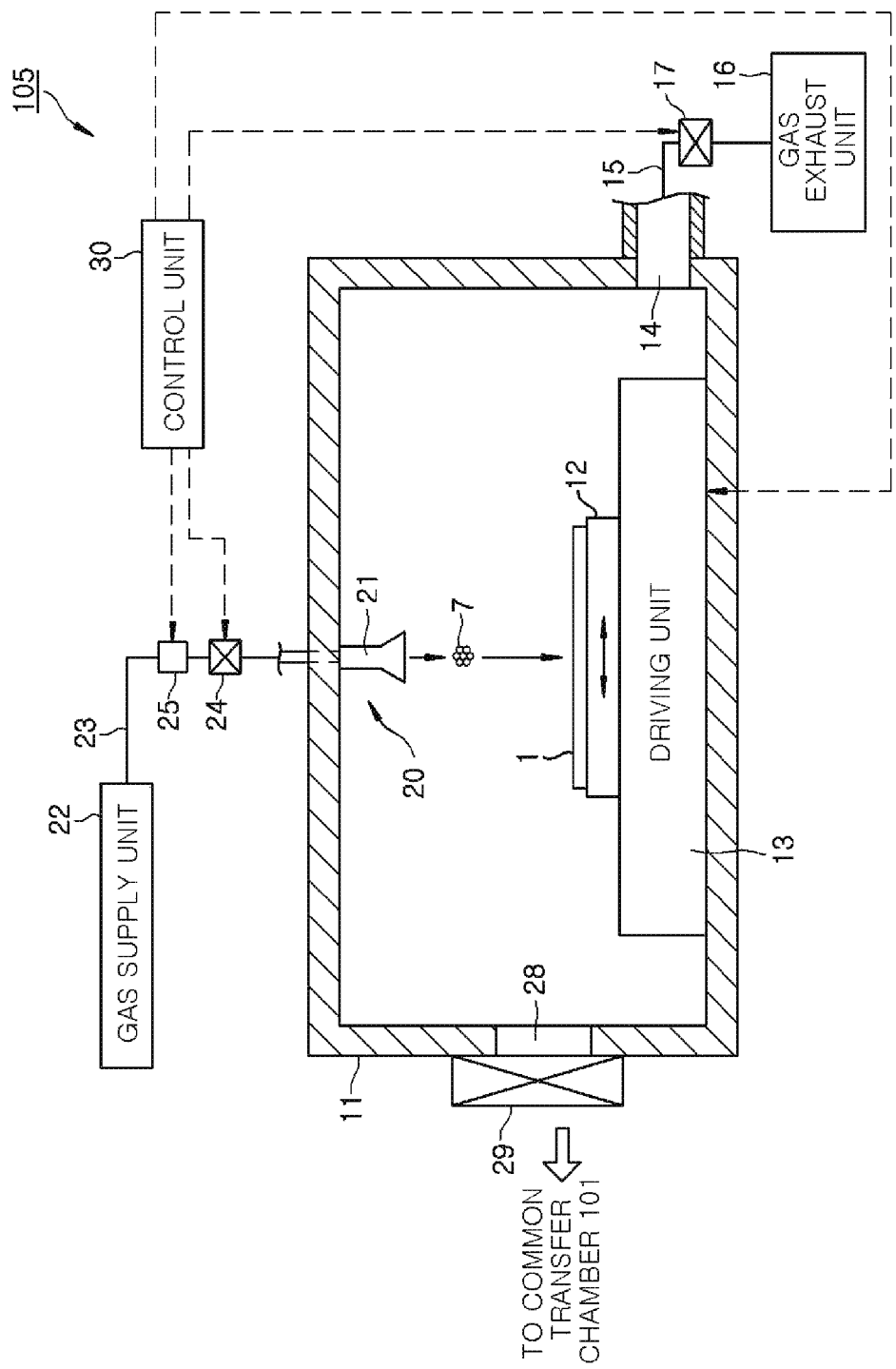
FIG. 4 is a cross sectional view schematically showing an example of a gas cluster module.

FIG. 4 is a cross sectional view schematically showing an example of the gas cluster module for cleaning a substrate.

The gas cluster module 105 processes the substrate by using gas clusters. The processing of the substrate may include processing of the residue of the silicon substrate 1 after the gas chemical etching.

As shown in FIG. 4, the gas cluster module 105 includes a processing chamber 11 for defining a processing chamber for processing a substrate. A substrate mounting table 12 is provided in the processing chamber 11 and the silicon substrate 1 is mounted thereon. The substrate mounting table 12 is movable in a plane by a driving unit 13 including, e.g., an XY table. Accordingly, the silicon substrate 1 mounted thereon is also movable in the plane.

A gas exhaust port 14 is provided at a lower portion of a sidewall of the processing chamber 11. A gas exhaust line 15 is connected to the gas exhaust port 14. A gas exhaust unit 16 including a vacuum pump or the like is provided in the gas exhaust line 15. The inside of the processing chamber 11 is vacuum-evacuated by the gas exhaust unit 16. A vacuum level at this time can be controlled by a pressure control valve 17 installed in the gas exhaust line 15.

A gas cluster irradiation unit 20 for irradiating the gas clusters 7 to the silicon substrate 1 is provided above the substrate mounting table 12. The gas cluster irradiation unit 20 includes a gas ejection nozzle 21 provided to face the substrate mounting table 12, a gas supply unit 22 for supplying a cluster generation gas to the gas ejection nozzle 21, a gas supply line 23 for guiding the cluster generation gas from the gas supply unit 22 to the gas ejection nozzle 21. An opening/closing valve 24 and a flow rate controller 25 are provided in the gas supply line 23. The gas ejection nozzle 21 is configured as a conical nozzle having a leading end that becomes gradually wider. However, the shape of the gas ejection nozzle 21 is not limited thereto. The gas ejection nozzle 21 may be configured as a small hole (orifice).

The cluster generation gas is supplied under pressure from the gas supply unit 22 through a booster unit (not shown) and ejected from the gas ejection nozzle 21. Accordingly, the ejected cluster generation gas is adiabatically expanded in the processing chamber 11 that has been vacuum-evacuated by the gas exhaust unit 16 and several to $10^7$ atoms or molecules of the cluster generation gas are aggregated by the Van Der Waals force. As a consequence, the gas clusters 7 are generated. The gas clusters 7 have a property of moving straight. The gas clusters 7 moving straight are irradiated onto the surface of the silicon substrate 1, so that the surface to be processed of the silicon substrate 1 is cleaned. At this time, as a difference between a pressure in the processing chamber 11 and a gas pressure before the ejection from the gas ejection nozzle 21 is increased, the energy of collision between the gas clusters ejected from the gas ejection nozzle 21 and the silicon substrate 1 can be increased. As for the gas cluster 7, a gas cluster ion beam that is ionized by an ionization unit may be used. However, the energy may be excessively increased, and this may cause adverse effect on the processing target film. Therefore, it is preferable to use, e.g., the gas clusters 7 generated by adiabatically expanding a gas as in this example, instead of an ionization unit, an acceleration unit or the like which is used in a current gas cluster ion beam technique.

The gas for generating the gas clusters 7 is not particularly limited and may be Ar gas, $N_2$ gas, $CO_2$ gas, $CF_4$ gas, $SF_6$ gas, $ClF_3$ gas, HF gas or the like. Steam such as $H_2O$ or the like may also be used. Such gases may be used separately or in combination with each other or with He gas.

A higher vacuum level (i.e., a lower pressure) in the processing chamber 11 is preferred in order to eject the generated gas clusters 7 to the silicon substrate 1 without destroying the generated gas cluster 7. When the supply pressure of the gas to the gas ejection nozzle 21 is 1 MPa or less, the vacuum level in the processing chamber 11 is preferably 10 Pa or less. When the supply pressure of the gas to the gas ejection nozzle 21 is 1 MPa to 5 MPa, the vacuum level in the processing chamber 11 is preferably 300 Pa or less.

Provided at a side surface of the processing chamber 11 is a loading/unloading port 28 for loading/unloading the silicon substrate 1. The loading/unloading port 28 can be opened and closed by a gate valve 29. The common transfer chamber 101 shown in FIG. 3 is connected to the gate valve 29.

As described above, the driving unit 13 moves the substrate mounting table 12 in the plane, so that the gas ejection nozzle 21 and the silicon substrate 1 are relatively moved. The driving unit 13 moves the substrate mounting table 12 such that the gas clusters 7 ejected from the gas ejection nozzle 21 are irradiated onto the entire top surface of the silicon substrate 1 on the substrate mounting table 12. The driving unit may move the gas ejection nozzle 21 instead of moving the substrate mounting table 12.

The gas cluster module 105 includes a control unit 30. The control unit 30 includes a controller having a microprocessor (computer) for controlling gas supply of the gas cluster module 105 (the opening/closing valve 24 and the flow rate controller 25), gas exhaust (the pressure control valve 17), the driving of the substrate mounting table 12 by the driving unit 13 and the like. The controller is connected to a keyboard through which an operator inputs a command to manage the gas cluster module 105, a display for visually displaying the operational states of the gas cluster module 105, and the like. Further, the controller is connected to a storage unit that stores therein control programs to be used in realizing processes performed in the gas cluster module 105 under the control of the controller, and control programs, i.e., processing recipes, to be used in controlling the respective components of the gas cluster module 105 to carry out a process under processing conditions, various data and the like. The recipes are stored in a suitable storage medium in the storage unit. If necessary, a desired recipe is read out from the storage unit and executed by the controller. Accordingly, a process of the step 14 shown in FIG. 1, for example, is performed in the gas cluster module 105 under the control of the controller.

The substrate processing method according to the first embodiment, especially the step 14, can be performed by the gas cluster module 105 shown in FIG. 4.

Second Embodiment (Reference Example)

Prior to the description of the second embodiment, a reference example of the second embodiment will be described.

Figure 5A:
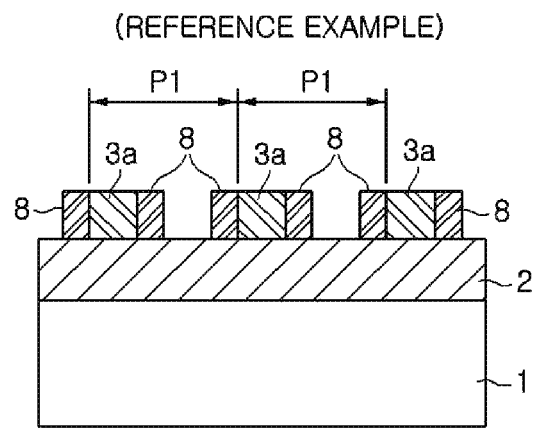
FIGS. 5A to 5C are cross sectional views schematically showing states of a processing target during processing according to a reference example of a second embodiment.
Figure 5B:
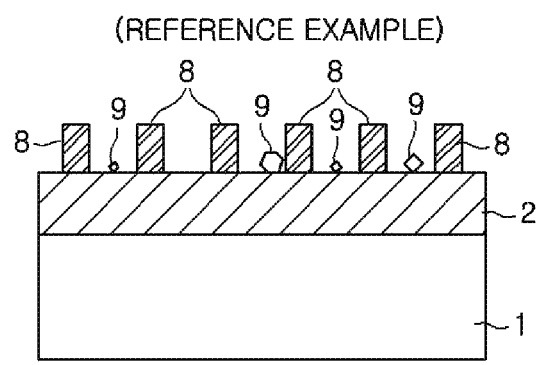
Figure 5C:
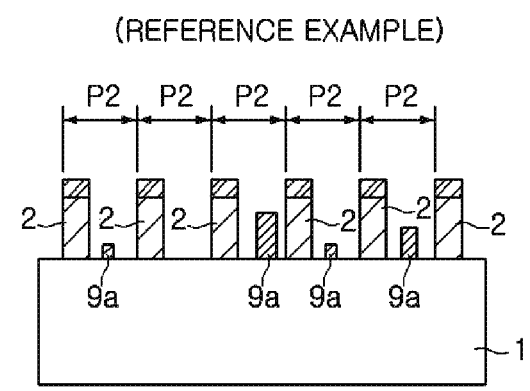

FIGS. 5A to 5C are cross sectional views schematically showing states of the target object during processing according to the reference example of the second embodiment.

For example, along with the trend toward high integration of semiconductor devices, miniaturization of a wiring width or an isolation width required for a manufacturing process advances. In general, a fine pattern is formed by a photolithography method. However, as the miniaturization advances, a fine pattern smaller than a resolution limit of the photolithography is required.

As for a technique for forming a fine pattern smaller than the resolution limit, there is known a technique referred to as "double patterning". In the double patterning, a pattern referred to as "cores 3a" is formed by using a photolithography method and sidewall spacer films 8 are formed on sidewalls of the cores 3a as shown in FIG. 5A. Then, the cores 3a are removed while leaving the sidewall spacer films 8 as shown in FIG. 5B. Next, a thin film 2 formed thereunder and used as a processing target film is anisotropically etched while using the remaining sidewall spacer films 8 as an etching mask as shown in FIG. 5C.

By using the double patterning, when the pattern of the cores 3a is a pattern P1 of the resolution limit of the photolithography method, a pattern P2 of the thin film 2 which is finally obtained can be smaller than the resolution limit.

However, if particles 9 remains after the removal of the cores 3a as shown in FIG. 5B, there occurs a shape defect due to particles referred to as "etching defect 9a" in the anisotropically etched thin film 2. Therefore, in the second embodiment, when the double patterning is performed, the following processes are carried out.

(Substrate Processing Method)

Figure 6:
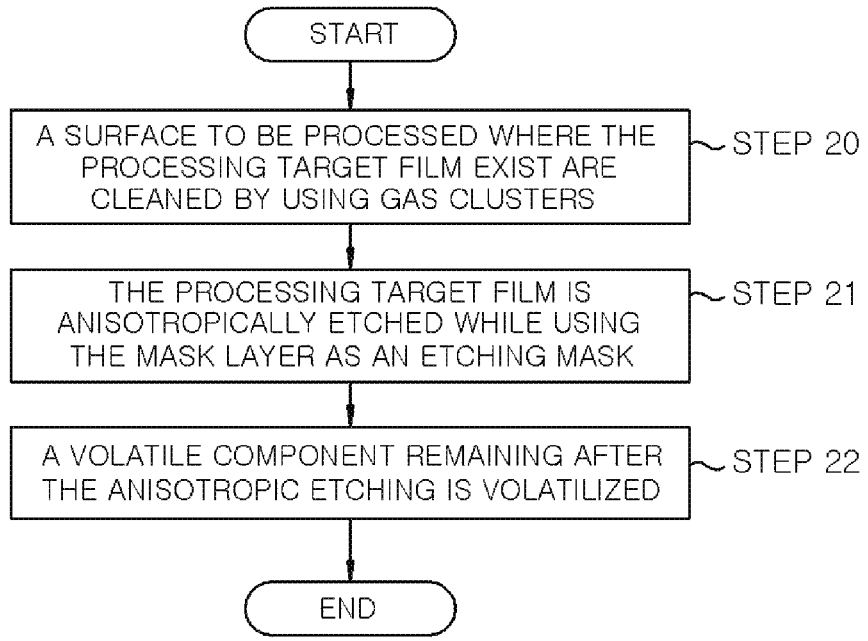
FIG. 6 is a flowchart showing an example of a substrate processing method according to the second embodiment.

FIG. 6 is a flowchart showing an example of a substrate processing method according to the second embodiment. FIGS. 7A to 7D are cross sectional views schematically showing states of a target object during a sequence shown in FIG. 6.

Figure 7A:
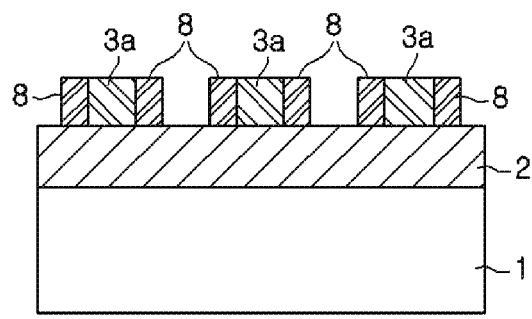
FIGS. 7A to 7D are cross sectional views schematically showing states of a target object during a sequence shown in FIG. 6.

First, as shown in FIG. 7A, a pattern referred to as "cores 3a" is formed by using the photolithography method and, then, sidewall spacer films 8 are formed on sidewalls of the cores 3a.

Figure 7B:
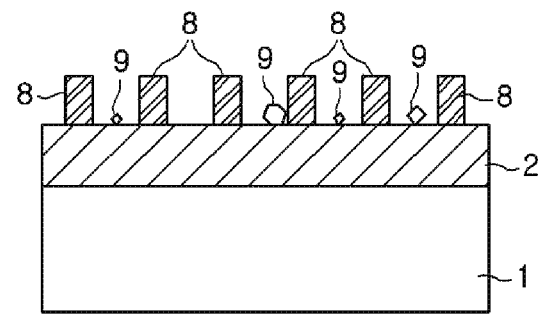

Next, as shown in FIG. 7B, the cores 3a are removed while leaving the sidewall spacer films 8. Accordingly, the mask layer formed of the sidewall spacer films 8 is formed on the thin film 2 that is a processing target film. Immediately after the removal of the cores 3a, particles 9 remain on the surface to be processed where the sidewall spacer films 8 as the mask layer and the thin film 2 as the processing target film exist.

Figure 7C:
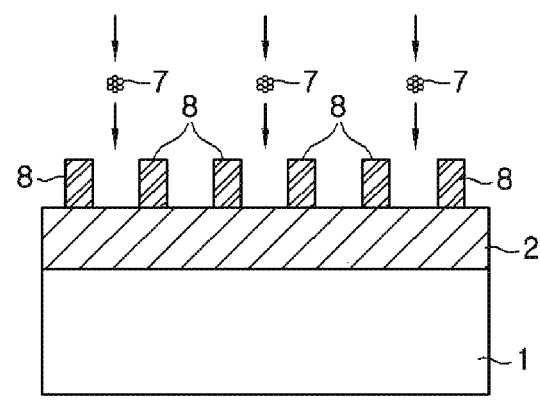

Next, as shown in a step 20 of FIG. 6 and FIG. 7C, the surface to be processed where the sidewall spacer films 8 as the mask layer and the thin film 2 as the processing target film exist are cleaned by using gas clusters. For example, the particles 9 and the thin film 2 are not chemically bonded, and the particles 9 are physically laminated on the thin film 2. Therefore, as in the case of the residues 6, the particles 9 have a physical strength weaker than that of the thin film 2 and can be physically removed by the gas clusters 7.

Figure 7D:
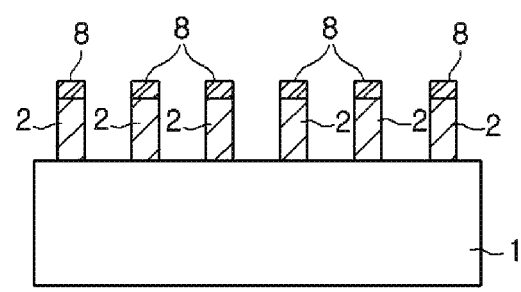

Then, as shown in a step 21 of FIG. 6 and FIG. 7D, the processing target film (thin film 2 in this example) is anisotropically etched while using the mask layer (sidewall spacer films 8 in this example) as an etching mask. For example, the anisotropic etching is a reactive ion etching (RIE). Then, as shown in a step 22 of FIG. 6, a volatile component remaining after the anisotropic etching is volatilized. The step 22 is executed by further performing, e.g., heat treatment on the target object that has been subjected to the anisotropic etching. The step 22 may be executed if necessary and may be omitted. Next, the sidewall spacer films 8 remaining on the anisotropically etched thin film 2 are removed, if necessary.

The substrate processing method according to the second embodiment can previously remove particles from the surface to be processed where the mask layer and the processing target film exist in the case of anisotropically etching the processing target layer while using the mask layer as a mask.

Therefore, it is possible to prevent a shape defect from occurring in the anisotropically etched processing target film.

(Substrate Processing System)

Figure 8:
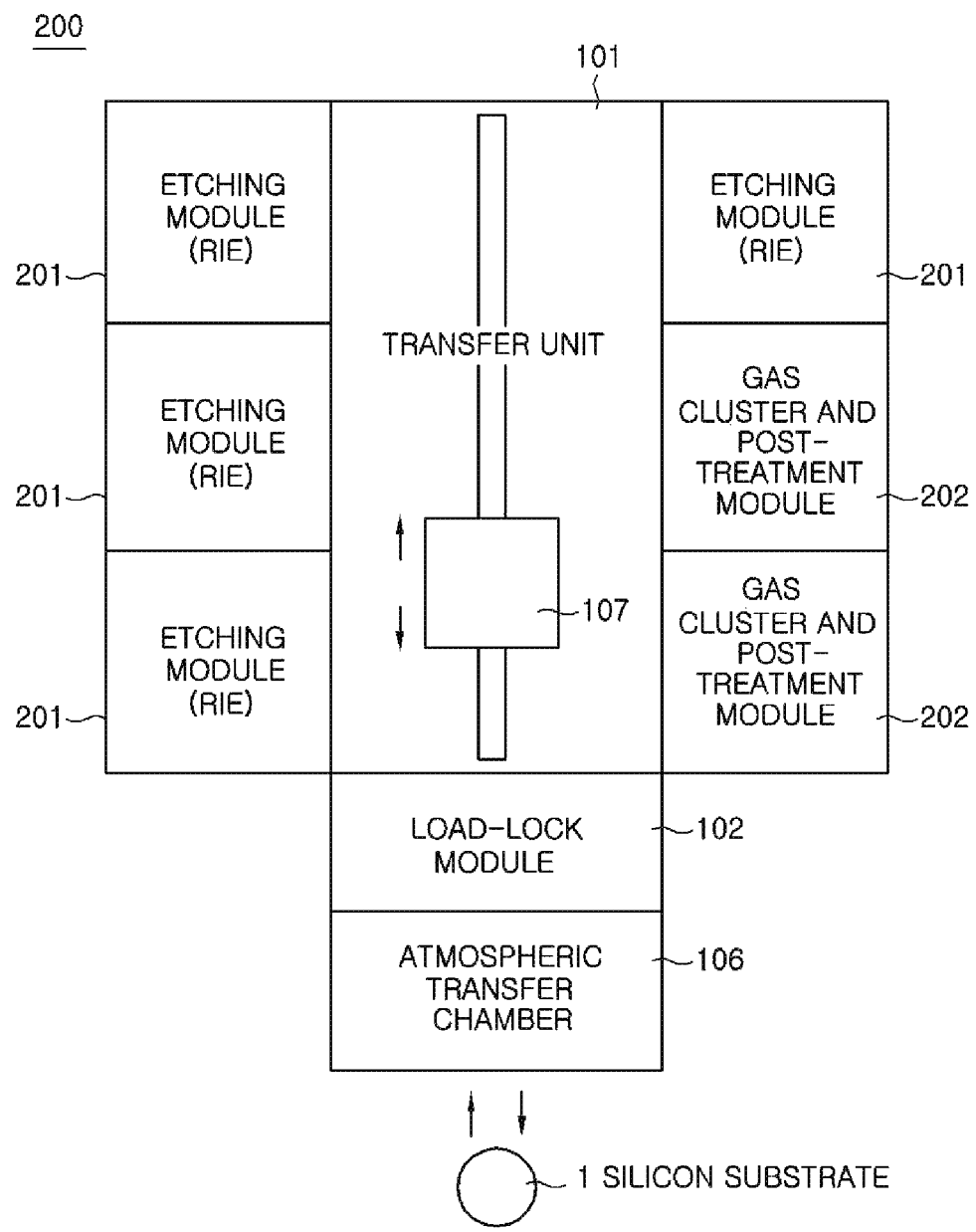
FIG. 8 is a top view showing an example of a substrate processing system capable of implementing the example of the substrate processing method according to the second embodiment.

FIG. 8 is a top view showing an example of a substrate processing system capable of performing the example of the substrate processing method according to the second embodiment.

As shown in FIG. 8, a substrate processing system 200 is different from the substrate processing system 100 shown in FIG. 3 in that an etching module (RIE) 201 is provided instead of the gas treatment modules 103; the post treatment module 104 is not provided; and the gas cluster modules 105 are configured as gas cluster and post-treatment modules 202 having a post-treatment function. The gas cluster and post-treatment modules 202 can be obtained by adding to the gas cluster module 105 shown in FIG. 4 a processing gas supply unit for supplying a processing gas used in the step 22 into the processing chamber 11 and a heating unit for heating the silicon substrate 1 on the substrate mounting table 12. The other configurations of the substrate processing system 200 may be substantially the same as those of the substrate processing system 100 shown in FIG. 3.

The transfer unit 107 is provided in the common transfer chamber 101. The transfer unit 107 unloads the silicon substrate 1 from the load-lock chamber to the common transfer chamber 101. Next, the transfer unit 107 loads the silicon substrate 1 into the gas cluster+post-treatment module 202.

In the gas cluster+post-treatment module 202, first, the step 20 (cleaning) shown in FIG. 6 is executed. Upon completion of the cleaning, the transfer unit 107 unloads the silicon substrate 1 from the gas cluster+post-treatment module 202. Then, the transfer unit 107 loads the silicon substrate 1 into the etching module 201.

In the etching module 201, the step 21 (anisotropic etching) shown in FIG. 6 is executed. Upon completion of the anisotropic etching, the transfer unit 107 unloads the silicon substrate 1 from the etching module 201. Then, the transfer unit 27 loads the silicon substrate 1 into the gas cluster+post-treatment module 202.

In the gas cluster+post-treatment module 202, the step 22 shown in FIG. 6 (heat treatment for volatilizing a volatile component) is executed. Upon completion of the heat treatment, the transfer unit 107 unloads the silicon substrate 1 from the gas cluster+post-treatment module 202. Then, the transfer unit 107 loads the silicon substrate 1 into the load-lock chamber of the load-lock module 102.

The substrate processing method according to the second embodiment can be performed by the substrate processing system 200 shown in FIG. 8.

Third Embodiment (Semiconductor Device Manufacturing Method)

Next, an example of a semiconductor device manufacturing method using the substrate processing method according to the embodiment will be described as a third embodiment of the present invention.

Figure 9:
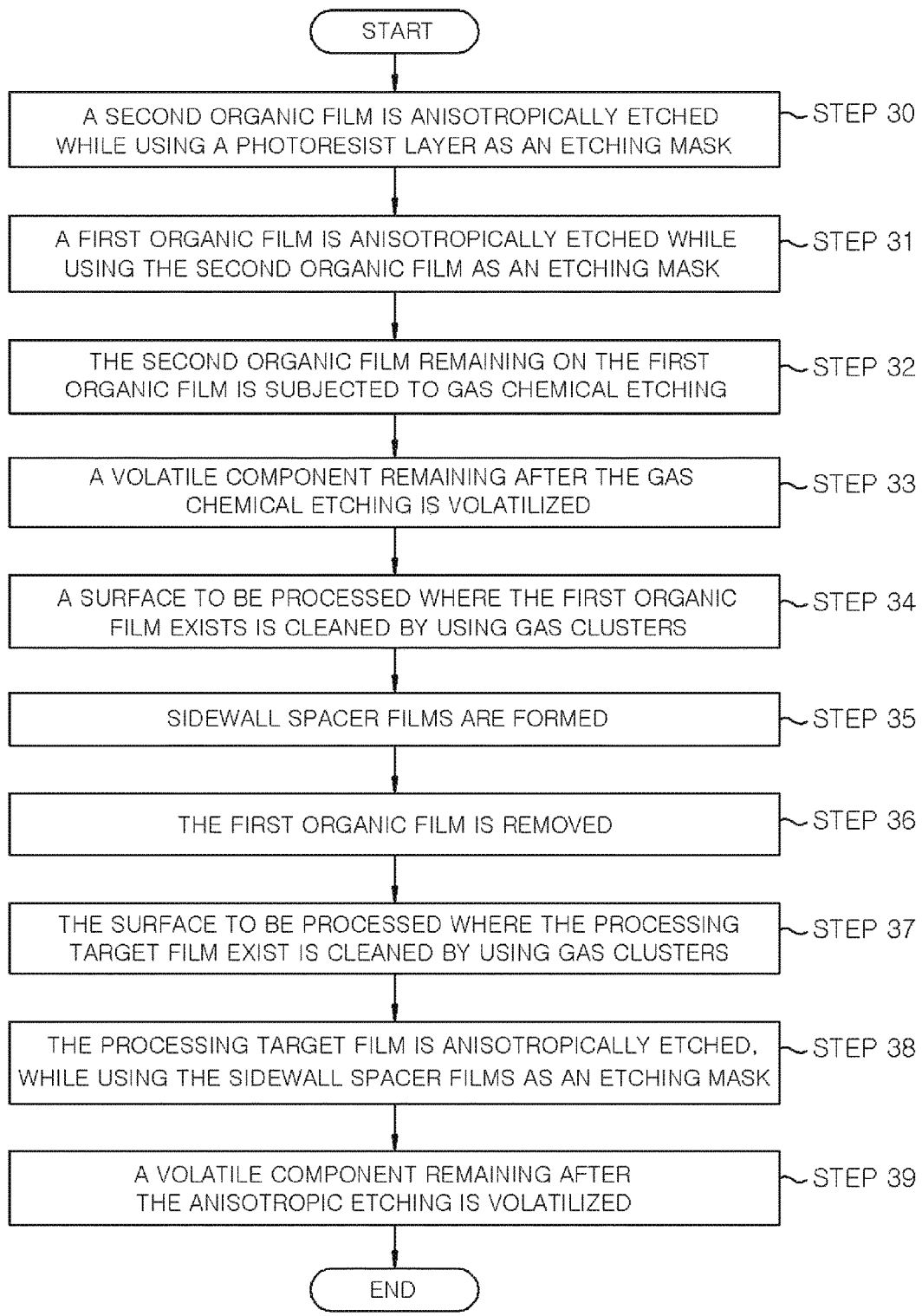
FIG. 9 is a flowchart showing an example of a semiconductor device manufacturing method according to a third embodiment.

FIG. 9 is a flowchart showing an example of the semiconductor device manufacturing method according to the third embodiment. FIGS. 10A to 10J are cross sectional views schematically showing states of a target object in a sequence shown in FIG. 9.

Figure 10A:
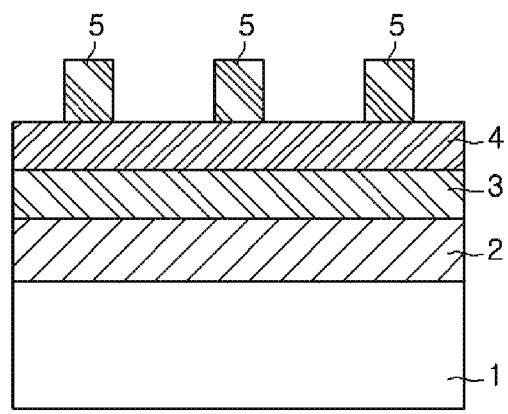
FIGS. 10A to 10J are cross sectional views schematically showing states of a target object during a sequence shown in FIG. 9.

First, as shown in FIG. 10A, a thin film 2 is formed on a silicon substrate 1. In this example, the thin film 2 is a first processing target film, and a pattern of the thin film 2 is a final target pattern. The thin film 2 may be made of a conductor, e.g., a metal, or may be made of an insulator (dielectric material) such as a low-k film or a high-k film. Next, a first organic film 3 is formed on the thin film 2. In this example, the first organic film 3 is a second processing target film and used as a core in the case of performing double patterning on the thin film 2. The first organic film 3 is, e.g., a carbon film. Then, a second organic film 4 is formed on the first organic film 3. In this example, the second organic film 4 is a third processing target film and used as a hard mask in the case of anisotropically etching the first organic film 3 and as an anti-reflection film in the photolithography method. The second organic film 4 is, e.g., a carbon-containing silicon oxide film. Next, a photoresist is coated on the second organic film 4 and a photoresist layer 5 is formed on the second organic film 4. Then, the photoresist layer 5 is exposed and developed by using the photolithography method and a pattern of the photoresist layer 5 is formed on the second organic film 4.

Figure 10B:
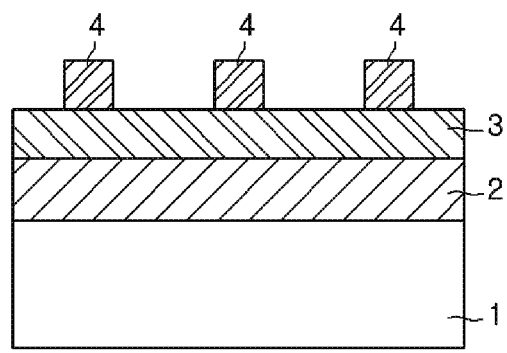

Next, as shown in a step 30 of FIG. 9 and FIG. 10B, the second organic film 4 is anisotropically etched by the RIE method while using the photoresist layer 5 as an etching mask. Then, the photoresist layer 5 remaining on the second organic film 4 is removed by ashing.

Figure 10C:
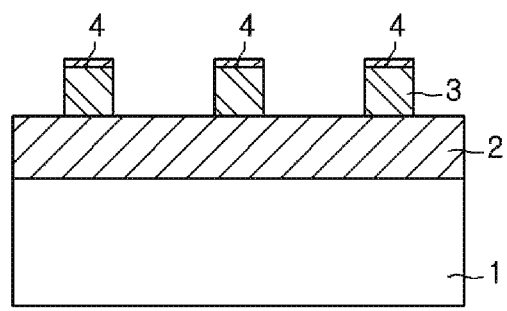

Next, as shown in a step 31 of FIG. 9 and FIG. 10C, the first organic film 3 is anisotropically etched by the RIE method while using the anisotropically etched second organic film 4 as an etching mask.

Figure 10D:
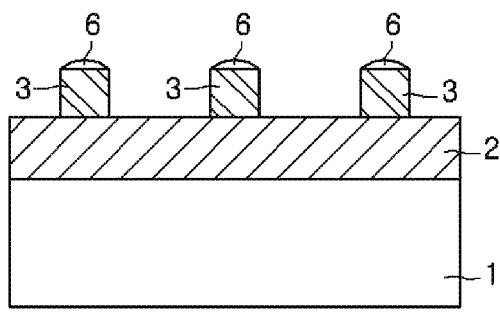

Next, as shown in a step 32 of FIG. 9 and FIG. 10D, the second organic film 4 remaining on the first organic film 3 is subjected to gas chemical etching. For example, when the second organic film 4 contains silicon oxide, HF gas is used for the gas chemical etching as in the first embodiment. Then, as shown in a step 33 of FIG. 9, a volatile component remaining after the gas chemical etching is volatilized. The step 33 may be performed by heat treatment as in the first embodiment. The step 33 may be omitted.

Figure 10E:
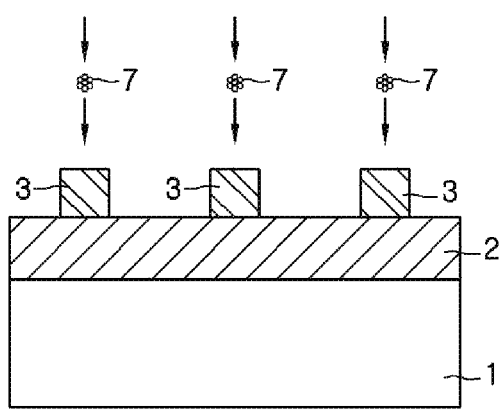

Next, as shown in a step 34 of FIG. 9 and FIG. 10E, the surface to be processed where the first organic film 3 exists is cleaned by irradiating gas clusters. Accordingly, as in the first embodiment, the residues 6 made of, e.g., carbon, which are physically laminated on the first organic film 3 are physically removed by the gas clusters 7.

Figure 10F:
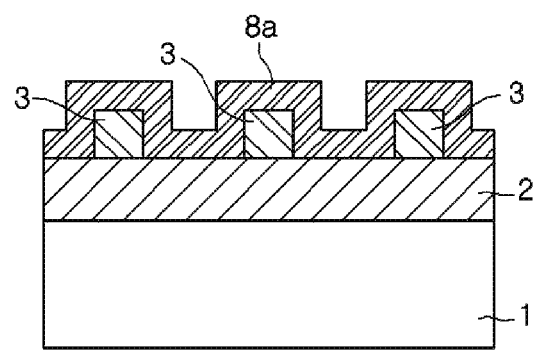
Figure 10G:
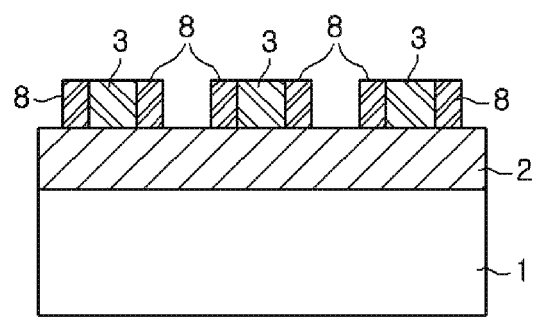

Next, as shown in a step 35 of FIG. 9, sidewall spacer films 8 are formed. In order to form the sidewall spacer films 8, first, a film 8a made of a material that can ensure an etching selectivity with respect to the thin film 2 and the first organic film 3 is formed on the surface to be processed where the first organic film 3 of the silicon substrate 1 exists as shown in FIG. 10F. The formed film 8a may be anisotropically etched by, e.g., the RIE method, as shown in FIG. 10G.

Figure 10H:
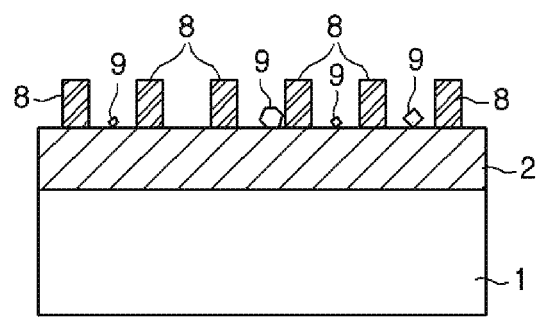

Next, as shown in a step 36 of FIG. 9 and FIG. 10H, the first organic film 3 is removed. Accordingly, a pattern of the mask layer formed of the sidewall spacer films 8 is formed.

Figure 10I:
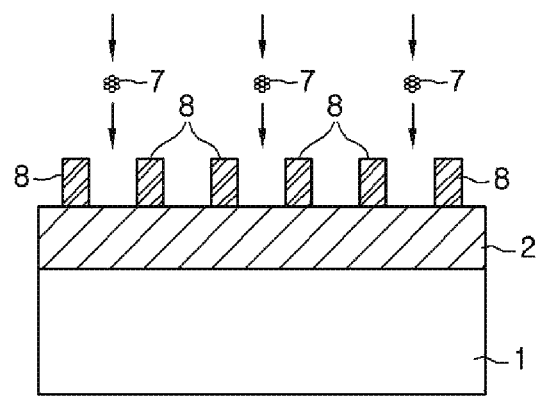

Next, as shown in a step 37 of FIG. 9 and FIG. 10I, the surface to be processed where the sidewall spacer films used as the mask layer and the thin film 2 exist is cleaned by irradiating gas clusters. Accordingly, the particles 9 laminated on the surface to be processed are physically removed by the irradiated gas clusters 7. The step 37 may be executed if necessary.

Figure 10J:
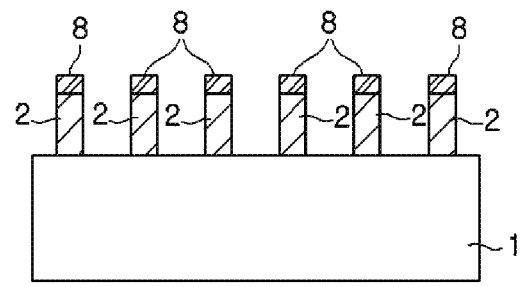

Next, as shown in a step 38 of FIG. 9 and FIG. 10J, the thin film 2 is anisotropically etched by, e.g., the RIE method, while using the sidewall spacer films 8 as an etching mask. Next, as shown in a step 39 of FIG. 9, a volatile component remaining after the anisotropic etching is volatilized. The step 39 is performed by heat treatment. The step 39 may be omitted.

In the semiconductor device manufacturing method according to the third embodiment, the cleaning using the irradiation of the gas clusters is performed after the gas chemical etching is performed on the remaining second organic film 4, so that it is possible to suppress the remaining of the residues 6 made of the same kind of material as the first organic film 3 on the first organic film 3. Accordingly, the first organic film 3 shown in FIGS. 10G and 10H, i.e., the core of the double patterning, can be more reliably and accurately removed compared to the case where the residues 6 remain on the first organic film 3.

Therefore, the double patterning process can be more accurately performed during the semiconductor device manufacturing process.

In addition, by performing the cleaning using the irradiation of the gas clusters after the removal of the core of the double patterning, i.e., the first organic film 3 in this example, particles generated in the removal of the first organic film 3 can be more completely removed. Accordingly, the shape defect of the pattern of the thin film 2 can be prevented.

(Other Applications)

The present invention can be variously modified without being limited to the above embodiments. For example, in the above embodiments, a laminated body of a carbon film and a carbon-containing silicon oxide has been described. However, the laminated body is not limited thereto. For example, a silicon nitride film may be used instead of the carbon film.

In the third embodiment, the example in which the present invention is applied to the semiconductor device manufacturing method including a double patterning process has been described. However, in addition to the double patterning process, the present invention can also be applied to a semiconductor device manufacturing method including a triple patterning process, a quadruple patterning process, or the like.

The present invention can be variously modified without departing from the scope thereof.

DESCRIPTION OF REFERENCE NUMERALS

1: silicon substrate
2: thin film (first processing target film)
3: processing target film (first organic film, second processing target film)
4: removal target film (second organic film, third processing target film)
5: photoresist layer
6: residue
7: gas cluster
8: sidewall spacer film
9: particle
9a: etching defect

What is claimed is:

1. A substrate processing method for forming a predetermined etching pattern on a target substrate, the method comprising:
   preparing a target substrate having a processing target film and a removal target film formed on the processing target film and used as an etching mask;
   patterning the removal target film in a predetermined pattern;
   anisotropically etching the processing target film by using the patterned removal target film as an etching mask;
   performing gas chemical etching on the removal target film remaining on the processing target film;
   performing heat treatment for volatilizing a volatile residue component remaining after the gas chemical etching; and
   performing cleaning by removing a non-reactant or a non-volatile residue remaining on the processing target film by irradiating gas clusters onto a surface to be processed including a surface of the processing target film after the gas chemical etching.

2. The substrate processing method of claim 1, wherein the non-reactant or the non-volatile residue and the processing target film have a common component.

3. A substrate processing method for forming a predetermined etching pattern on a target substrate, the method comprising:
   preparing a target substrate having a processing target film and a mask layer formed in a predetermined pattern on the processing target film and used as an etching mask;
   performing cleaning by removing particles on a space portion of the mask layer by irradiating gas clusters onto a surface to be processed including a surface of the mask layer and a surface of the processing target film;
   anisotropically etching the processing target film by using the mask layer as an etching mask; and
   performing heat treatment for volatilizing a volatile residue component remaining after the anisotropic etching.

4. The substrate processing method of claim 1, wherein the gas clusters used in the cleaning are generated by adiabatically expanding a cluster generation gas supplied under pressure.

5. A semiconductor device manufacturing method using a semiconductor substrate including a laminated body in which at least a first processing target film, a second processing target film, a third processing target film and a mask layer are laminated upward in that order on the substrate, the method comprising:
   anisotropically etching the third processing target film by using the mask layer as an etching mask;
   anisotropically etching the second processing target film by using the anisotropically etched third processing target film as an etching mask;
   performing gas chemical etching on the third processing target film remaining on the second processing target film;
   performing cleaning by removing a non-reactant or a non-volatile residue remaining on a surface of the second processing target film by irradiating gas clusters onto a surface to be processed including the surface of the second processing target film after the gas chemical etching;
   forming a sidewall spacer film on a surface of the first processing target film which is partially exposed and a side surface of the anisotropically etched second processing target film;
   removing the second processing target film; and
   anisotropically etching the first processing target film by using the sidewall spacer film as an etching mask layer.

6. The semiconductor device manufacturing method of claim 5, further comprising, between said removing the second processing target film and said anisotropically etching the first processing target film, performing cleaning by removing particles remaining on a surface of the first processing target film by irradiating gas clusters onto a surface to be processed where the sidewall spacer film and the first processing target film exist.

7. The semiconductor device manufacturing method of claim 5, further comprising, between said performing gas chemical etching on the third processing target film and said performing cleaning, performing heat treatment for volatilizing a volatile residue component remaining after the gas chemical etching.

8. The semiconductor device manufacturing method of claim 5, further comprising, after said anisotropically etching the first processing target film, performing heat treatment for volatilizing a volatile residue component remaining after the anisotropic etching.

9. The semiconductor device manufacturing method of claim 5, wherein the gas clusters used in the cleaning are generated by adiabatically expanding a cluster generation, gas supplied under pressure.

* * * * *